United States Patent
Kim et al.

(10) Patent No.: US 9,780,198 B2
(45) Date of Patent: Oct. 3, 2017

(54) METHOD FOR MANUFACTURING HIGH-PERFORMANCE AND LOW-POWER FIELD EFFECT TRANSISTOR OF WHICH SURFACE ROUGHNESS SCATTERING IS MINIMIZED OR REMOVED

(71) Applicant: UNIST (ULSAN NATIONAL INSTITUTE OF SCIENCE AND TECHNOLOGY), Ulsan (KR)

(72) Inventors: Kyung Rok Kim, Ulsan (KR); Sung Ho Kim, Daejeon (KR); Jong Yul Park, Seoul (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/316,367

(22) PCT Filed: Dec. 9, 2014

(86) PCT No.: PCT/KR2014/012061
§ 371 (c)(1),
(2) Date: Dec. 6, 2016

(87) PCT Pub. No.: WO2016/076473
PCT Pub. Date: May 19, 2016

(65) Prior Publication Data
US 2017/0243953 A1     Aug. 24, 2017

(30) Foreign Application Priority Data
Nov. 14, 2014  (KR) ........................ 10-2014-0158895

(51) Int. Cl.
*H01L 29/66*   (2006.01)
*H01L 21/308*  (2006.01)

(52) U.S. Cl.
CPC ...... *H01L 29/66742* (2013.01); *H01L 21/308* (2013.01)

(58) Field of Classification Search
CPC . H01L 29/785; H01L 27/1211; H01L 27/0266
See application file for complete search history.

(56) References Cited

FOREIGN PATENT DOCUMENTS

| KR | 10-2009-0125148 A | 12/2009 |
| KR | 10-2010-0111241 A | 10/2010 |

(Continued)

OTHER PUBLICATIONS

Korean Patent Abstract (in English) of KR Pub. No. 10-2009-0125148 A, Pub. Date Dec. 3, 2009, downloaded Nov. 22, 2016 from http://kpa.kipris.or.kr/kpa/.

(Continued)

*Primary Examiner* — Mohammad Choudhry
(74) *Attorney, Agent, or Firm* — Barcelo, Harrison & Walker, LLP

(57) ABSTRACT

Aspects of the present invention relate to a method for manufacturing a high-performance and low-power field effect transistor (FET) element of which surface roughness scattering is minimized or removed, comprising: a first step of etching a strained silicon substrate into a pin structure; a second step of stacking undoped SiGe thereon; a third step of etching the undoped SiGe; a fourth step of etching after performing lithography; a fifth step of stacking doped SiGe thereon; a sixth step of etching the doped SiGe after performing lithography; and a step of forming a transistor element by sequentially stacking an oxide and a gate metal on the doped SiGe and there is an effect of enabling the implementation of a Fin HEMT capable of having all of good channel controllability and a high on-current, which are advantages of a FinFET, and high electron mobility, which is an advantage of an HEMT.

4 Claims, 4 Drawing Sheets

(56) References Cited

FOREIGN PATENT DOCUMENTS

KR   10-2013-0050382 A   5/2013
KR   10-2014-0085540 A   7/2014

OTHER PUBLICATIONS

Korean Patent Abstract (in English) of KR Pub. No. 10-2010-0111241 A, Pub. Date Oct. 14, 2010, downloaded Nov. 22, 2016 from http://kpa.kipris.or.kr/kpa/.
WIPO Patent Abstract (in English) of WO Int'l Pub. No. 2012/040681 A2, Int'l Pub. Date Mar. 29, 2012 (KR Pub. No. 10-2013-0050382 A, Pub. Date May 15, 2013).
WIPO Patent Abstract (in English) of WO Int'l Pub. No. 2013/095346 A1, Int'l Pub. Date Jun. 27, 2013 (KR Pub. No. 10-2014-0085540 A, Pub. Date Jul. 7, 2014).

METHOD FOR MANUFACTURING HIGH-PERFORMANCE AND LOW-POWER FIELD EFFECT TRANSISTOR OF WHICH SURFACE ROUGHNESS SCATTERING IS MINIMIZED OR REMOVED

CROSS-REFERENCE TO RELATED APPLICATIONS

This application is the national stage for International Patent Cooperation Treaty Application PCT/KR2014/012061, filed Dec. 9, 2014, which claims priority from Korean Patent Application No. 10-2014-0158895, filed on Nov. 14, 2014, in the Korean Intellectual Property Office. The entire contents of said application are incorporated herein by reference.

BACKGROUND OF THE DISCLOSURE

Technical Field

The present invention relates to a method for manufacturing a high-performance and low-power field effect transistor element of which surface roughness scattering is minimized or removed, and particularly, to a method for manufacturing a high-performance and low-power field effect transistor element of which surface roughness scattering is minimized or removed, which stacks and etches undoped and doped SiGe on strained silicon and stacks an oxide and a gate metal while using the doped SiGe as a source/drain in order to take high electron mobility which is an advantage of an HEMT as a high-performance semiconductor device by enhancing low mobility of electrons due to surface roughness scattering which is a disadvantage of a multi-gate low-power semiconductor device having high gate control power, such as a FinFET and enhance gate leakage current which is the disadvantage of the HEMT, and the like.

Background Art

Performance of a transistor has been improved through scaling of a device size and low-cost, high-integration, low-power, and high-speed circuit can be manufactured through scaling by researches in the related art, but a flat silicon MOSFET which is a transistor which has been primarily used has been limited in scaling while a short-channel effect has been intensified as the size of the MOSFET becomes 32 nm or less.

In order to enhance such a performance deterioration phenomenon, a stereoscopic structure semiconductor device which is known as a multi-gate MOSFET or FinFET has been developed.

In the case of the multi-gate MOSFET, since multiple gates surround a channel area, a gate field-effect exerts a large influence on the channel area. Therefore, the multi-gate MOSFET can acquire higher driving current than the flat MOSFET and further, control power of a gate for a channel on which current flows which is one of the core elements for determining the performance of the transistor is improved to suppress the short-channel effect.

As a capacity of a dielectric that insulates the gate and the channel increases and the thickness of a body decreases, the control power of the gate increases. To this end, as a new-structure transistor using a thin body, a FinFET and a UTBSOI are representatively provided.

Research into the FinFET as a promising candidate that will succeed the flat transistor in the related art between the FinFET and the UTBSOI is in active progress. Representatively, US Intel Corporation released a chip to which 22 nm FinFET process technology is applied in 2012, and the like, therefore, an importance thereof has increased. However, the FinFET has a disadvantage that mobility of electrons is lower due to surface roughness scattering than high channel controllability.

Unlike the FinFET, a high electron mobility transistor (HEMT) has an advantage that the surface roughness scattering is suppressed by not a channel electron organic scheme by gate voltage but a quantum well channel scheme in which channel electrons have already been collected to show the high electron mobility, but a disadvantage that gate leakage current and off-current are relatively higher. Further, since various materials including an undoped spacer and a channel material are inserted in order to fabricate a quantum well, high parasitic resistance is generated between a source and a drain and a process is complicated.

With the development of strained silicon, research into a silicon-based strained silicon HEMT is also in progress. However, as a capping layer of the strained silicon HEMT, general silicon which does not have a large band gap difference is used, and as a result, high off-current is generated. As a result, on and off cannot be distinguished and the HEMT cannot be driven as the transistor.

DISCLOSURE

Technical Problem

Aspects of the present invention are contrived to solve all of the problems and an object of aspects of the present invention is to provide a method for manufacturing a high-performance and low-power field effect transistor element of which surface roughness scattering is minimized or removed, which enhances and supplements surface roughness scattering which is a disadvantage of a FinFET and high gate leakage current and off-current which is a disadvantage of an HEMT and simplifies complexity of an HEMT structure in which various materials are inserted between a source/drain and a channel in a process procedure by using doped SiGe as the source/drain.

Technical Solution

In order to achieve the object, a method for manufacturing a high-performance and low-power field effect transistor element of which surface roughness scattering is minimized or removed, includes: a first step of etching a strained silicon on an insulator into a pin structure; a second step of stacking undoped SiGe on the strained silicon having the pin structure; a third step of etching the undoped SiGe; a fourth step of lithographing and then, etching the undoped SiGe; a fifth step of stacking doped SiGe on the undoped SiGe; a sixth step of etching the doped SiGe in the pin structure after performing lithography; and a seventh step of forming a transistor element by sequentially stacking an oxide and a gate metal on the doped SiGe etched in the pin structure.

Further, the lithography may include all general semiconductor lithography technologies of photo-lithography or electronic beam lithography.

In addition, the oxide may include all of generally used insulating film materials of silicon oxide ($SiO_2$) or hafnium oxide ($HfO_2$).

Moreover, the doped SiGe may be used as a source/drain.

Advantageous Effects

According to a method for manufacturing a high-performance and low-power field effect transistor element of which surface roughness scattering is minimized or removed, there is an effect of enabling the implementation of a FinHEMT capable of having all of good channel controllability and a high on-current, which are advantages of a FinFET, and high electron mobility, which is an advantage of an HEMT and there is an effect that a process procedure is simple in spite of an HEMT structure by using doped SiGe as a source/drain.

DETAILED DESCRIPTION

Best Mode

Hereinafter, a preferred exemplary embodiment of a method for manufacturing a high-performance and low-power channel field effect transistor element of which surface roughness scattering according to the present invention is minimized or removed will be described in detail with reference to the accompanying drawings. However, the present invention is not limited to the exemplary embodiment set forth below, and may be embodied in various different forms. The present exemplary embodiments are just for rendering the description of the present invention complete and are set forth to provide a complete understanding of the scope of the invention to a person with ordinary skill in the technical field to which the present invention pertains.

Figure 1:
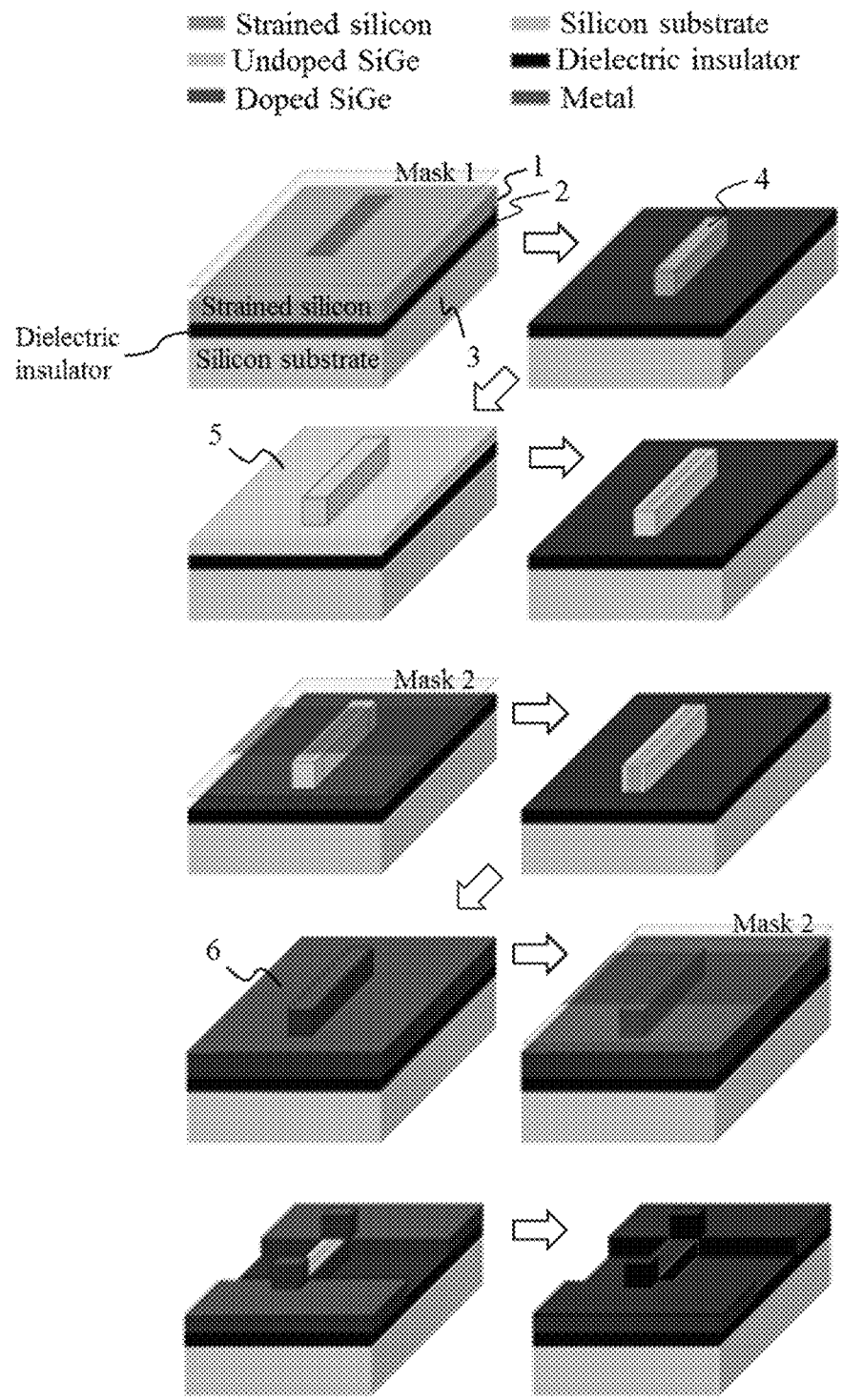
FIG. 1 is a perspective view illustrating a manufacturing process of a field effect transistor manufactured by a manufacturing method according to aspects of the present invention.

FIG. 1 is a perspective view illustrating a manufacturing process of a field effect transistor manufactured by a manufacturing method according to aspects of the present invention.

As illustrated in FIG. 1, a high-performance and low-power channel field effect transistor element without or minimizing surface roughness scattering according to the present invention is first etched in a pin structure 4 by lithographing strained silicon 1 on an insulator (alternatively, a graded SiGe buffer layer) (a first step). The strained silicon technology as a design technology that forcibly detaches atoms of semiconductor silicon is a technology that electrons may more rapidly move when an atom is detached from another atom to increase performance of a semiconductor.

Next, undoped SiGe 5 in which a dopant is not doped on the strained silicon having the pin structure is stacked (a second step).

Next, the undoped SiGe 5 is etched (a third step).

Next, the undoped SiGe 5 is etched by lithographing a pin (a fourth step).

Next, doped SiGe 6 in which the dopant is doped on the strained silicon 1 on which undoped SiGe 5 is stacked is thickly stacked (a fifth step).

Next, the strained silicon 1 is etched in a Fin structure 4 by lithographing the strained silicon 1 on which the undoped SiGe 5 and the doped SiGe 6 are stacked and the doped SiGe 6 is used as a source 7/a drain 8 (a sixth step).

Next, the undoped SiGe 5 and the doped SiGe 6 are stacked and an oxide and a metal are sequentially stacked on the strained silicon 1 etched in the pin structure 4 to complete a field effect transistor element 10 of the present invention, which is implemented as a FinHEMT using the oxide (a seventh step).

Mode for Invention

Figure 2:
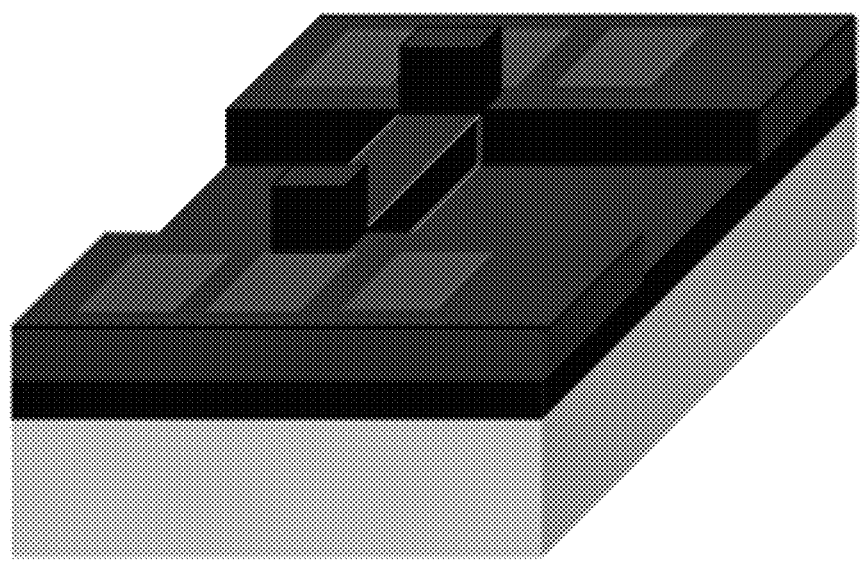
FIG. 2 is an exploded perspective view of a field effect transistor manufactured by a manufacturing method according to aspects of the present invention.
Figure 3:
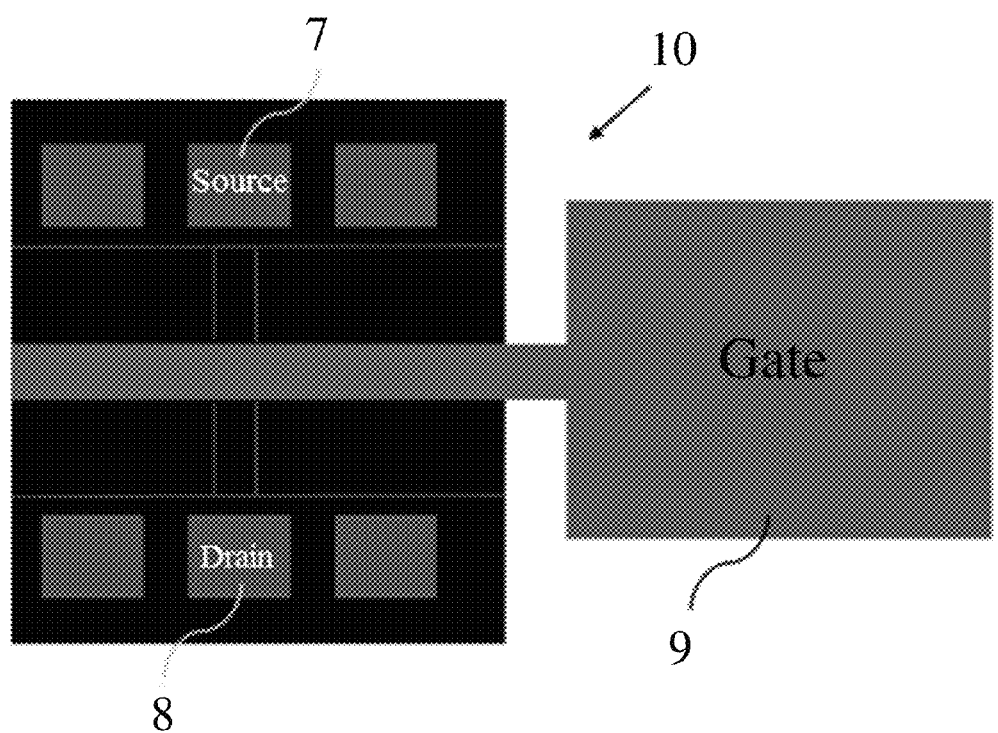
FIG. 3 is a plan view of the field effect transistor manufactured by the manufacturing method according to aspects of the present invention.

FIG. 2 is an exploded perspective view of a field effect transistor manufactured by a manufacturing method according to aspects of the present invention and FIG. 3 is a plan view of the field effect transistor manufactured by the manufacturing method according to aspects of the present invention.

As illustrated in FIGS. 2 and 3, after the sixth step in which the strained silicon 1 on which the undoped SiGe 5 and the doped SiGe 6 are stacked is etched in the pin structure 4, while one side of the doped SiGe 6 is made of the source 7 and the other side of the doped SiGe 6 is made of the drain 8, the oxide 2 is stacked and a gate metal 9 is stacked throughout the oxide 2 to complete the field effect transistor element 10 of aspects of the present invention.

Figure 4:
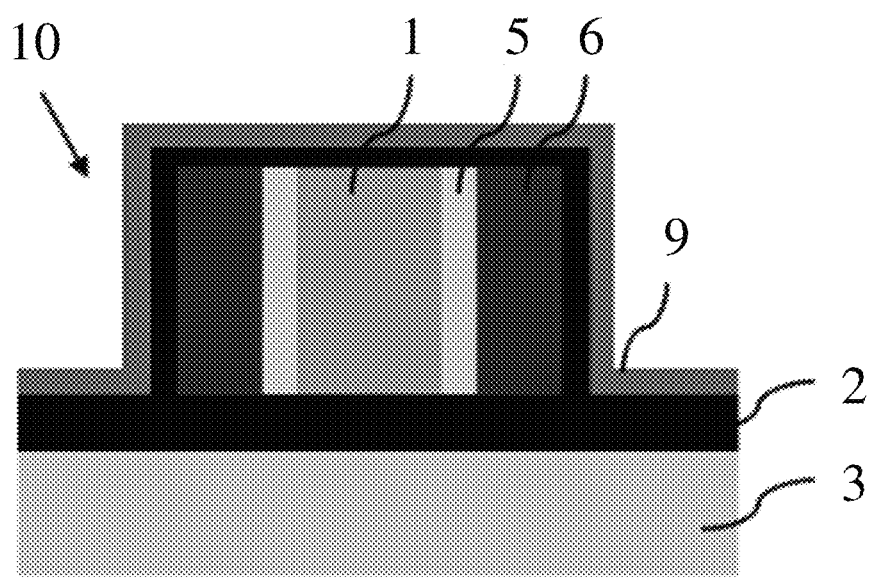
FIG. 4 is a longitudinal cross-sectional view of the field effect transistor manufactured by the manufacturing method according to aspects of the present invention.

FIG. 4 is a longitudinal cross-sectional view of the field effect transistor manufactured by the manufacturing method according to aspects of the present invention.

As illustrated in FIG. 4, the field effect transistor 10 manufactured by the manufacturing method according to aspects of the present invention is configured by sequentially stacking the strained silicon 1 having the pin structure, the undoped SiGe 5, the doped SiGe 6, the oxide 2, and the gate metal 9.

Leakage current between the doped SiGe 6 and the gate metal 9 is suppressed with the oxide 2 and electrons which are transferred from the doped SiGe 6 are collected in the strained silicon 1 channel to acquire fast electrons. Further, low contact resistance is acquired and the process procedure is simplified by using the thickly stacked doped SiGe 6 (one material) as the source/drain.

The method for manufacturing a high-performance and low-power field effect transistor element of which surface roughness scattering is minimized or removed according to aspects of the present invention has been described as above with reference to the illustrated drawings, but the present invention is not limited by the exemplary embodiment and the drawings disclosed in the present specification and various modifications can be made by those skilled in the art within the scope of the technical spirit of the present invention, of course.

Industrial Applicability

The present invention can be usefully used as a high-performance and low-power field-effect transistor element which can implement a FinHEMT capable of taking both the good channel controllability and the high on-current which are advantages of the FinFET and the high electron mobility which is the advantage of the HEMT.

Further, aspects of the present invention can be usefully used as a high-performance and low-power field-effect transistor element capable of achieving the simple process procedure in spite of the HEMT structure by using the doped SiGe as the source/drain.

What is claimed is:

1. A method for manufacturing a high-performance and low-power field effect transistor element of which surface roughness scattering is minimized or removed, the method comprising:
    forming a doped SiGe;
    a first step of etching a strained silicon on an insulator into a pin structure;
    a second step of stacking undoped SiGe on the strained silicon on the strained silicon having the pin structure;
    a third step of etching the undoped SiGe;
    a fourth step of lithographing and then, etching the undoped SiGe;
    a fifth step of stacking the doped SiGe on the undoped SiGe;
    a sixth step of etching the doped SiGe in the pin structure after performing lithography; and a seventh step of forming a transistor element by sequentially stacking an oxide and a gate metal on the doped SiGe etched in the pin structure.

2. The method for manufacturing a high-performance and low-power field effect transistor element of which surface roughness scattering is minimized or removed of claim 1, wherein the lithography includes all general semiconductor lithography technologies of photo-lithography or electronic beam lithography.

3. The method for manufacturing a high-performance and low-power field effect transistor element of which surface roughness scattering is minimized or removed of claim 1, wherein the oxide includes all of generally used insulating film materials of silicon oxide ($SiO_2$) or hafnium oxide ($HfO_2$).

4. The method for manufacturing a high-performance and low-power field effect transistor element of which surface roughness scattering is minimized or removed of claim 1, wherein the doped SiGe is used as a source/drain.

* * * * *